United States Patent
Yang et al.

(10) Patent No.: US 10,419,016 B2
(45) Date of Patent: *Sep. 17, 2019

(54) ANALOG-DIGITAL CONVERTER AND ANALOG-TO-DIGITAL CONVERSION METHOD

(71) Applicant: Huawei Technologies Co., Ltd., Shenzhen (CN)

(72) Inventors: Jinda Yang, Shanghai (CN); Liren Zhou, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 15/972,827

(22) Filed: May 7, 2018

(65) Prior Publication Data

US 2018/0254781 A1   Sep. 6, 2018

Related U.S. Application Data (63) Continuation of application No. 15/633,474, filed on Jun. 26, 2017, now Pat. No. 9,991,902, which is a (Continued)

(30) Foreign Application Priority Data

Dec. 26, 2014   (CN) .......................... 2014 1 0836902

(51) Int. Cl.
*H03M 1/12* (2006.01)
*H03M 1/66* (2006.01)
(Continued)

(52) U.S. Cl.
CPC .............. *H03M 1/747* (2013.01); *G06F 1/10* (2013.01); *G10L 15/12* (2013.01);
(Continued)

(58) Field of Classification Search
CPC ...... H03M 1/747; H03M 1/42; H03M 1/1205; H03M 1/76; H03M 1/12; G10L 15/12
(Continued)

(56) References Cited

U.S. PATENT DOCUMENTS 5,886,562 A   3/1999   Garrity et al.
6,724,239 B2   4/2004   Price et al.
(Continued)

FOREIGN PATENT DOCUMENTS

CN   1973533 A   5/2007
CN   101102112 A   1/2008
(Continued)

OTHER PUBLICATIONS

Fu et al., "The implementation of single-phase power-gating adiabatic circuits using improved CAL circuits," Pacific-Asia Conference on Circuits, Communications and Systems, 2009, PACCS 09, XP031526128, Institute of Electrical and Electronics Engineers, New York New York (2009).
(Continued)

*Primary Examiner* — Jean B Jeanglaude
(74) *Attorney, Agent, or Firm* — Leydig, Voit & Mayer, Ltd.

(57) ABSTRACT

An ADC and an analog-to-digital conversion method are provided. The ADC includes: a clock generator, including M transmission gates, where the M transmission gates are configured to receive a first clock signal that is periodically sent and separately perform gating control on the first clock signal, so as to generate M second clock signals, M is an integer that is greater than or equal to 2; M ADC channels that are configured in a time interleaving manner, configured to receive one analog signal and separately perform, under the control of the M second clock signals, sampling and analog-to-digital conversion on the analog signal, so as to
(Continued)

obtain M digital signals, where each ADC channel is corresponding to one clock signal of the M second clock signals; and an adder, configured to add the M digital signals together in a digital field, so as to obtain a digital output signal.

14 Claims, 7 Drawing Sheets

Related U.S. Application Data continuation of application No. PCT/CN2015/095695, filed on Nov. 26, 2015.

(51) Int. Cl.
| | |
|---|---|
| H03M 1/74 | (2006.01) |
| G10L 15/12 | (2006.01) |
| H03M 1/38 | (2006.01) |
| H03M 1/42 | (2006.01) |
| H03M 1/76 | (2006.01) |
| G06F 1/10 | (2006.01) |
| H03M 1/08 | (2006.01) |

(52) U.S. Cl.
CPC ....... *H03M 1/0836* (2013.01); *H03M 1/1205* (2013.01); *H03M 1/38* (2013.01); *H03M 1/42* (2013.01); *H03M 1/76* (2013.01); *H03M 1/1215* (2013.01)

(58) Field of Classification Search
USPC ................................. 341/155, 144; 375/136
See application file for complete search history.

(56) References Cited

U.S. PATENT DOCUMENTS

| 8,310,290 | B2 | 11/2012 | Agarwal | |
| 8,736,309 | B2* | 5/2014 | Garrity | H03K 5/1515 |
| | | | | 326/93 |
| 9,000,962 | B1 | 4/2015 | Leuciuc | |
| 9,369,142 | B2 | 6/2016 | Qiu | |
| 2006/0165198 | A1 | 7/2006 | Tietjen | |
| 2008/0231484 | A1 | 9/2008 | Moore et al. | |
| 2009/0115650 | A1 | 5/2009 | Tietjen et al. | |
| 2010/0117878 | A1 | 5/2010 | Sheng et al. | |
| 2010/0259308 | A1 | 10/2010 | Wang et al. | |
| 2012/0133535 | A1 | 5/2012 | Verbruggen | |
| 2013/0223481 | A1 | 8/2013 | Flammer | |
| 2014/0015703 | A1 | 1/2014 | Pullela et al. | |
| 2014/0327474 | A1* | 11/2014 | Jordan | H03K 17/162 |
| | | | | 327/141 |

FOREIGN PATENT DOCUMENTS

| CN | 101272146 A | 9/2008 |
| CN | 101534141 A | 9/2009 |
| CN | 101562453 A | 10/2009 |
| CN | 101674087 A | 3/2010 |
| CN | 103023507 A | 4/2013 |
| CN | 104702285 A | 6/2015 |
| EP | 2421174 A1 | 2/2012 |

OTHER PUBLICATIONS

Jakonis et al.,"A 2.4-GHz RF sampling receiver Front-End in 0.18-μm CMOS", IEEE Journal of Solid-State Circuits, XP011133174, Institute of Electrical and Electronics Engineers, New York New York (Jun. 2005).

Kurosawa et al.,"Explicit analysis of channel mismatch effects in time-interleaved ADC systems", IEEE Transactions on Circuits and Systems vol. 48, No. 3, XP011012283, Institute of Electrical and Electronics Engineers, New York New York (Mar. 2001).

Folkesson et al., "Robust multi-phase clock generation with reduced jitter," SOC Conference, 2004, Proceedings, XP010743824, Institute of Electrical and Electronics Engineers, New York New York (2004).

\* cited by examiner

ANALOG-DIGITAL CONVERTER AND ANALOG-TO-DIGITAL CONVERSION METHOD

CROSS-REFERENCE TO RELATED APPLICATIONS

This application is a continuation of U.S. patent application Ser. No. 15/633,474, filed on Jun. 26, 2017, which is a continuation of International Application No. PCT/CN2015/095695, filed on Nov. 26, 2015, which claims priority to Chinese Patent Application No. 201410836902.9, filed on Dec. 26, 2014. All of the afore-mentioned patent applications are hereby incorporated by reference in their entireties.

TECHNICAL FIELD

The present invention relates to the field of electronic technologies, and in particular, to an Analog-Digital Converter and an analog-to-digital conversion method.

BACKGROUND

Currently, with rapid development of computer, communication, and multimedia technologies and the like, a digitalization level in the high-tech field is continuously improved. An Analog-Digital Converter (Analog-Digital Converter, ADC) needs to be used at both a front end and a back end of an advanced electronic system; and especially in modern digital communications applications such as a radar, a sonar, high-speed and high-resolution video display and image display, medical imaging, a high-performance controller, a high-performance transmitter, and various radio receivers, a requirement on performance of a high-speed and high-precision ADC is increasingly high.

Figure 1:
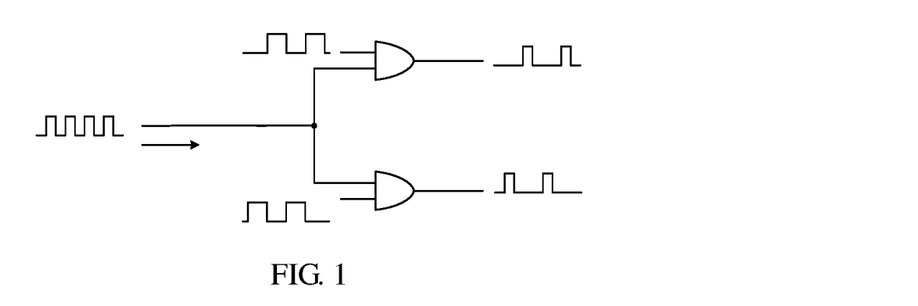
FIG. 1 is an architecture diagram of a clock generator according to the prior art.

For the purpose of implementing high speed performance, a current high-precision ADC generally uses a manner of time interleaving to connect multiple high-precision ADCs in parallel, so as to form a multi-channel ADC. For multiple clock signals corresponding to the multi-channel ADC, in a conventional technical solution, the multiple corresponding clock signals are centrally generated by using a clock generator that includes multiple D triggers that are connected in series. In this conventional technical solution, because all clock signals go through different D triggers and output drivers, when there is a process deviation between the multiple D triggers, a time skew (time skew) between clocks generally reaches a picosecond (Picosecond, ps) level. Because the time skew exists, a harmonic related to a clock frequency appears on a spectrum obtained from different ADC channels by means of analog-to-digital conversion, and therefore affects a conversion precision of the multi-channel ADC. A method shown in FIG. 1 is used in the prior art to resolve the problem. FIG. 1 shows two AND gates that are disposed in parallel, where the two AND gates are separately configured to receive one input clock signal and perform, by using a same-source clock signal, retiming on the two input clock signals that are separately received by the two AND gates, so that falling edges, which are of two output clock signals that are obtained after an AND operation is performed on the two AND gates, are determined by falling edges of the same-source clock signal. After the retiming is performed, the time skew between the two output clock signals may reach a magnitude of hundreds of femtoseconds (Femtosecond, fs). However, in sampling performed by a high-speed high-precision time-interleaving ADC, as a frequency of an input signal increases, the time skew at the magnitude of hundreds of femtoseconds can hardly meet a linearity requirement, and therefore it is urgent to design a clock generator with a lower time skew.

SUMMARY

Embodiments of the present invention provide an Analog-Digital Converter and an analog-to-digital conversion method, so as to implement a time skew of a lower level and meet a requirement of a high-speed and high-precision interleaving Analog-Digital Converter for the time skew.

According to a first aspect, the present invention provides an Analog-Digital Converter, including: a clock generator, including M transmission gates, where the M transmission gates are configured to receive a first clock signal that is periodically sent and separately perform gating control on the first clock signal, so as to generate M second clock signals, M is an integer that is greater than or equal to 2, each period of the first clock signal includes M clock pulses, a period of each second clock signals is equal to the period of the first clock signal, and the period of each second clock signal includes one clock pulse of the M clock pulses; M ADC channels, configured to receive one analog signal and separately perform, under the control of the M second clock signals, sampling and analog-to-digital conversion on the analog signal, so as to obtain M digital signals, where each ADC channel is corresponding to one clock signal of the M second clock signals; and an adder, configured to add the M digital signals together in a digital field, so as to obtain a digital output signal.

In a first possible implementation manner of the first aspect, phases of the M second clock signals form an arithmetic progression whose common difference is $2\pi/M$, where $2\pi$ indicates a period of the M second clock signals.

With reference to the first aspect or the first possible implementation manner of the first aspect, in a second possible implementation manner, any ADC channel of the M ADC channels includes a sample-and-hold circuit and an analog-to-digital conversion circuit that are connected in series, where the sample-and-hold circuit is configured to receive the analog signal and perform, under the control of one clock signal of the M second clock signals, sampling on the analog signal, so as to obtain a first sampling signal; and the analog-to-digital conversion circuit is configured to perform analog-to-digital conversion on the first sampling signal under the control of the one clock signal, so as to obtain a digital signal.

With reference to the first aspect or the first possible implementation manner of the first aspect or the second possible implementation manner of the first aspect, in a third possible implementation manner, the M transmission gates include at least one of a complementary metal oxide semiconductor CMOS transmission gate, a P-channel metal oxide semiconductor PMOS transmission gate, or an N-channel metal oxide semiconductor NMOS transmission gate.

With reference to the third possible implementation manner of the first aspect, in a fourth possible implementation manner, the at least one CMOS transmission gate includes: a PMOS transistor and an NMOS transistor, where: a source electrode of the PMOS transistor, a drain electrode of the NMOS transistor, and a signal input end of the at least one CMOS transmission gate are connected at one point, and a drain electrode of the PMOS transistor, a source electrode of the NMOS transistor, and a signal output end of the at least one CMOS transmission gate are connected at one point; or a source electrode of the PMOS transistor, a source electrode of the NMOS, and a signal input end of the at least one CMOS transmission gate are connected at one point, and a drain electrode of the PMOS transistor, a drain electrode of the NMOS transistor, and a signal output end of the at least one CMOS transmission gate are connected at one point; the signal input end is configured to receive the first clock signal; and a gate electrode of the PMOS transistor and a gate electrode of the NMOS transistor are separately used as a control end of the at least one CMOS transmission gate and are configured to perform gating control on the first clock signal under an effect of a control signal, so as to obtain a second clock signal at the signal output end and output the second clock signal, where the control signal is generated by an external logic circuit or obtained by performing a logic operation according to the first clock signal.

With reference to the third possible implementation manner of the first aspect or the fourth possible implementation manner of the first aspect, in a fifth possible implementation manner, the gate electrode of the PMOS transistor is specifically configured to receive the control signal, and the gate electrode of the NMOS transistor is specifically configured to receive an inverting signal of the control signal, so as to control on-state of the at least one CMOS transmission gate, thereby implementing gating control on the first clock signal.

With reference to any one of the first aspect and the first to the fifth possible implementation manners of the first aspect, in a sixth possible implementation manner, the Analog-Digital Converter further includes: an oscillator, configured to generate the first clock signal.

With reference to any one of the first aspect and the first to the fifth possible implementation manner of the first aspect, in a seventh possible implementation manner, the first clock signal is a system clock signal that is independent of the ADC.

With reference to any one of the first aspect and the first to the seventh possible implementation manner that are of the first aspect, in an eighth possible implementation manner, the clock generator further includes a buffer, configured to: receive the first clock signal, enhance a driving capability of the first clock signal, and transmit the first clock signal with an enhanced driving capability to the M transmission gates.

According to a second aspect, the present invention provides an analog-to-digital conversion method, applied to an Analog-Digital Converter ADC, where the ADC includes a clock generator, M ADC channels, and an adder, and the clock generator includes M transmission gates; and the method includes: receiving, by the clock generator, a first clock signal that is periodically sent, and performing, by using the M transmission gates, gating control on the first clock signal, so as to generate M second clock signals, where M is an integer that is greater than or equal to 2, each period of the first clock signal includes M clock pulses, a period of each second clock signals is equal to the period of the first clock signal, and the period of each second clock signal includes one clock pulse of the M clock pulses; receiving, by the M ADC channels, one analog signal and separately performing, under the control of the M second clock signals, sampling and analog-to-digital conversion on the analog signal, so as to obtain M digital signals, where each ADC channel is corresponding to one clock signal of the M second clock signals; and adding, by the adder, the M digital signals together in a digital field, so as to obtain a digital output signal.

In a first possible implementation manner of the second aspect, phases of the M second clock signals form an arithmetic progression whose common difference is $2\pi/M$, where $2\pi$ indicates a period of the M second clock signals.

With reference to the second aspect or the first possible implementation manner of the second aspect, in a second possible implementation manner of the second aspect, the method further includes: receiving, by the clock generator, a system clock in a system in which the ADC is located and using the system clock as the first clock signal, or generating the first clock signal by means of oscillation.

According to a third aspect, the present invention provides a radio transceiver, including: a frequency mixer and the ADC according to any one of the foregoing first aspect and the first to the eighth possible implementation manner that are of the first aspect, where the frequency mixer is configured to receive a radio-frequency signal, and perform, by using a preset local-frequency signal, frequency mixing on the radio-frequency signal to obtain an analog fundamental-frequency signal; and the ADC is configured to receive the analog fundamental-frequency signal and perform digital-to-analog conversion on the analog fundamental-frequency signal, so as to obtain and output a digital fundamental-frequency signal.

According to the ADC and the radio transceiver that are provided in the present invention, because a clock generator in an ADC does not use a logic gate in a process of generating M second clock signals but uses M transmission gates to directly and separately perform gating control on a first same-source clock signal so as to obtain the M second clock signals, a time skew between the second clock signals is related only to switch-on resistances of MOS transistors in all transmission gates. When all the transmission gates are on, the MOS transistors in all the transmission gate are in a deep linear region, and threshold voltage changes of all the transmission gates imposes very little impact on mismatching between the switch-on resistances, so that a time skew between all the second clock signals is extremely low. Therefore, the ADC provided in the present invention can be used to implement a time skew of a lower level, thereby meeting a requirement of a high-speed high-precision interleaving Analog-Digital Converter for the time skew.

BRIEF DESCRIPTION OF DRAWINGS

To describe the technical solutions in the embodiments of the present invention or in the prior art more clearly, the following briefly describes the accompanying drawings required for describing the embodiments or the prior art. Apparently, the accompanying drawings in the following description show merely some embodiments of the present invention, and a person of ordinary skill in the art may still derive other drawings from these accompanying drawings without creative efforts.

DESCRIPTION OF EMBODIMENTS

To make the objectives, technical solutions, and advantages of the embodiments of the present invention clearer, the following clearly describes the technical solutions in the embodiments of the present invention with reference to the accompanying drawings in the embodiments of the present invention. Apparently, the described embodiments are some but not all of the embodiments of the present invention. All other embodiments obtained by a person of ordinary skill in the art based on the embodiments of the present invention without creative efforts shall fall within the protection scope of the present invention.

Figure 2A:
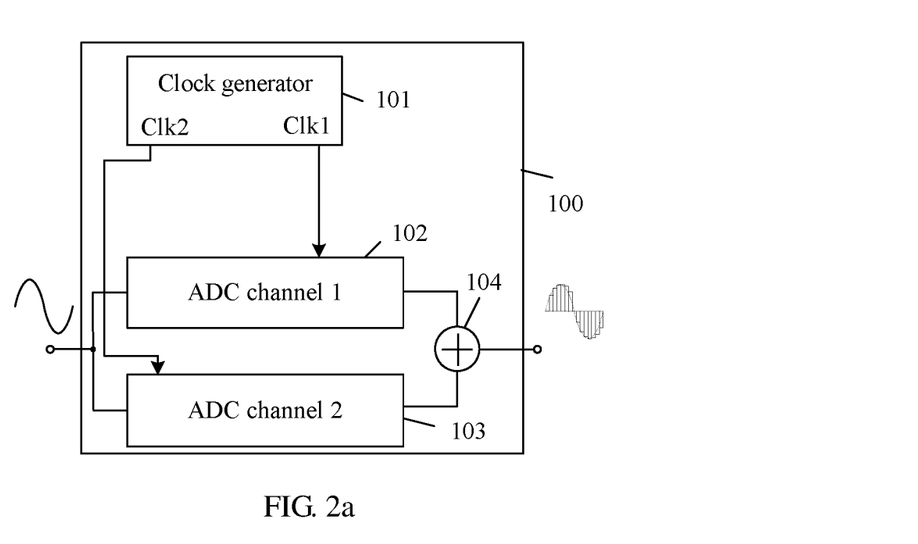
FIG. 2a is an architecture diagram of an Analog-Digital Converter according to an embodiment of the present invention.

As shown in FIG. 2a, an embodiment of the present invention provides an ADC 100, including:

a clock generator 101, including M transmission gates, where the M transmission gates are configured to receive a first clock signal that is periodically sent and separately perform gating control on the first clock signal, so as to generate M second clock signals, where M is an integer that is greater than or equal to 2, each period of the first clock signal includes M clock pulses, a period of the M second clock signals is equal to the period of the first clock signal, and each period of the M second clock signals includes one clock pulse of the M clock pulses;

M ADC channels, where two ADC channels (that is, 102 and 103) are used herein as an example for exemplary description, where the M ADC channels are configured to receive one analog signal and separately perform, under the control of the M second clock signals, sampling and analog-to-digital conversion on the analog signal, so as to obtain M digital signals, where each ADC channel is corresponding to one clock signal of the M second clock signals; and an adder, configured to add the M digital signals together in a digital field, so as to obtain a digital output signal.

In this embodiment, the M transmission gates include at least one of a complementary metal oxide semiconductor CMOS transmission gate, a P-channel metal oxide semiconductor PMOS transmission gate, or an N-channel metal oxide semiconductor NMOS transmission gate. That is, any transmission gate of the M transmission gates may be the CMOS transmission gate, the PMOS transmission gate, or the NMOS transmission gate; or may be formed by combining multiple transmission gates, for example, two CMOS transmission gates connected in series form a new transmission gate. A specific implementation manner of a transmission gate may be determined according to performance; for example, if a performance requirement is relatively high, the CMOS transmission gate is used, or if a performance requirement is relatively low, the PMOS transmission gate or the NMOS transmission gate may be used. For example, if a voltage domain of the first clock signal is between 0 V (Volt) and 0.9 V and a voltage domain of a gate electrode control signal of all transmission gates is between 0 V and 2.5 V, that is, the voltage domain of the first clock signal is lower than the voltage domain of the gate electrode control signal of all the transmission gates, a single NMOS transmission gate may be used.

In this embodiment, phases of the M second clock signals form an arithmetic progression whose common difference is $2\pi/M$, where $2\pi$ indicates a period of the M second clock signals.

The following uses an example in which all the M transmission gates are CMOS transmission gates to further describe the Analog-Digital Converter 100 provided in this embodiment. The clock generator 101 provided in this embodiment performs, by using multiple CMOS transmission gates, gating control on a first same-source clock signal, so as to generate multiple second clock signals. Because in a gating control process, a clock pulse in each period of the first clock signal is transmitted by using a channel between a source electrode and a drain electrode that are of each MOS transistor (that is, the PMOS transistor and the NMOS transistor) in the CMOS transmission gate, and does not pass through any logic gate in the signal transmission process, a time skew between the multiple second clock signals is related only to mismatching between switch-on resistances introduced by the multiple CMOS transmission gates because of a change of a threshold voltage $V_{th}$. When the CMOS transmission gate is on, all MOS transistors are in a deep linear region, and a relationship between a switch-on resistance R and the threshold voltage $V_{th}$ of the MOS transistor is shown by using the following formula:

$$R = \frac{1}{\beta[V_{gs} - (V_{th} + \Delta V_{th})]} \tag{1}$$

$V_{gs}$ is a gate-source voltage, $\Delta V_{th}$ is a change amount of the threshold voltage, and $\beta$ is a conduction factor.

Because the $\Delta V_{th}$ is generally very small when compared with the threshold voltage $V_{th}$, it can be learned from the foregoing formula that when the CMOS transmission gate is on, the $\Delta V_{th}$ imposes very little impact on the switch-on resistance, that is, mismatching between the threshold voltages of the respective MOS transistors of the multiple CMOS transmission gates imposes very little impact on the time skew between the multiple second clock signals. A gating control principle of transmission gates such as the PMOS transmission gate and the NMOS transmission gate in the gating control process is similar to the gating control principle of the CMOS transmission gate, and therefore is not described in detail herein again.

However, in a conventional technology, various logic gate devices are generally configured to perform gating control on a first clock signal to generate multiple second clock signals. A MOS phase inverter is used as an example herein for description. In the phase inverter, an on-state current $I_D$ between a source electrode and a drain electrode of a MOS transistor in the phase inverter is shown in formula (2):

$$I_D = \beta(V_{gs} - V_{th})^2 \tag{2}$$

Formula (3) may be obtained by solving for a partial derivative according to formula (2).

$$dI_D = 2\beta(V_{gs} - V_{th})(dV_{gs} - dV_{th}) = 0 \tag{3}$$

When the on-state current $I_D$ is assigned an extreme value, a relationship between $\Delta V_{th}$ (that is, $dV_{th}$) and $\Delta V_{gs}$ (that is, $dV_{gs}$) is as follows:

$$dV_{gs} = dV_{th} = \Delta V_{in} \tag{4}$$

$\Delta V_{gs}$ indicates a change amount of the gate-source voltage, $\Delta V_{in}$ indicates a change amount of an input voltage of the MOS phase inverter. It can be learned that in a case in which time sequence mismatching that is introduced by all logic gate devices because of different conduction factors β is not considered, the time sequence mismatching that is between second clock signals and generated by using the various logic gates is caused by the change of the threshold voltage; that is, in a process of generating second clock signals that are required by multiple ADC channels, if a logic gate device is used, because thresholds between logic gate devices are different, the second clock signals generated by using these logic gates can hardly meet a requirement for a high-speed high-precision ADC. It should be noted that the logic gates described herein include but are not limited to logic devices such as an AND gate, a NOT gate, an NAND gate, and an AND-OR gate.

By using the technical solution provided in this embodiment of the present invention, clock mismatching of a femtosecond level may be implemented between the multiple second clock signals, so that the requirement for the high-speed high-precision ADC in low mismatching of a clock signal is met.

Figure 2B:
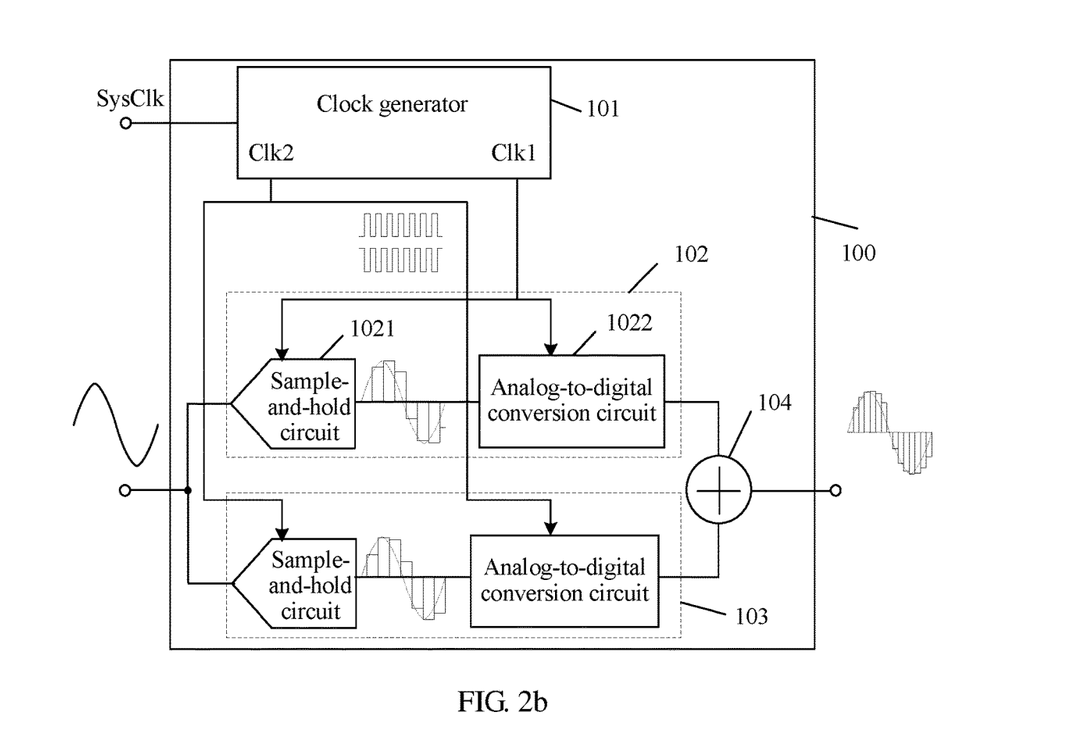
FIG. 2b is an architecture diagram of another Analog-Digital Converter according to an embodiment of the present invention.
Figure 2C:
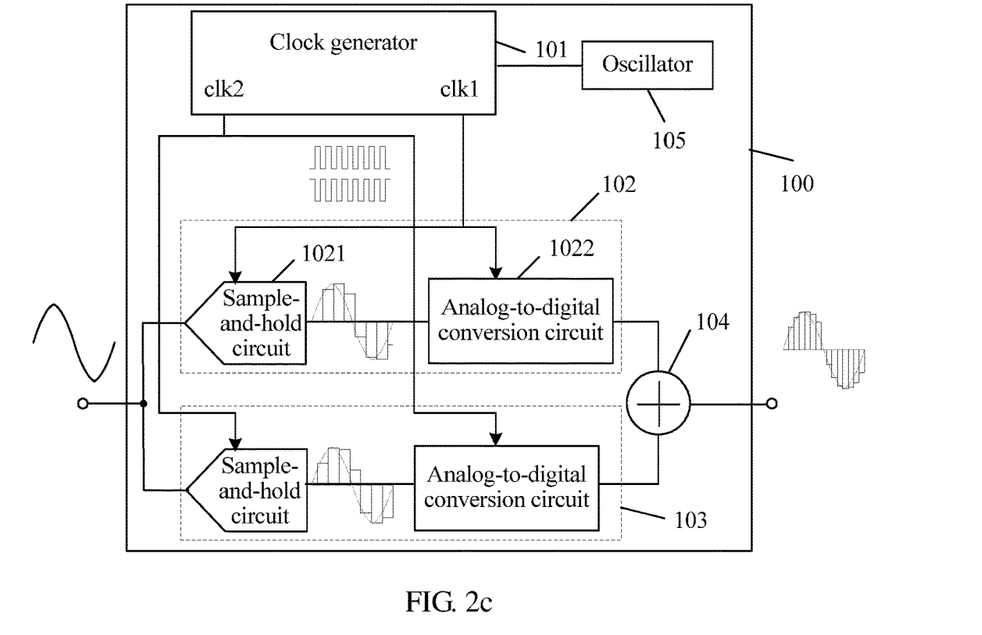
FIG. 2c is an architecture diagram of still another Analog-Digital Converter according to an embodiment of the present invention.
Figure 5:
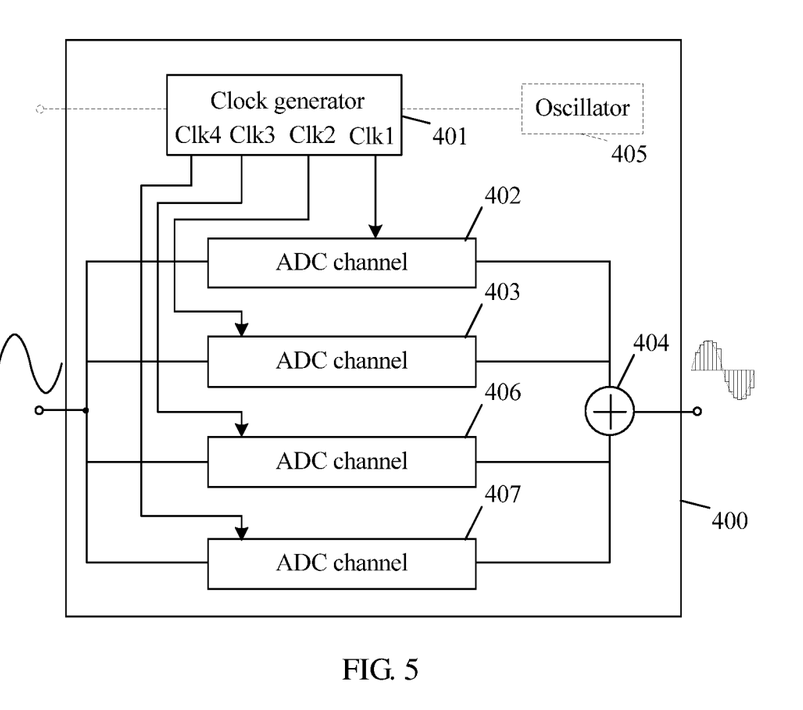
FIG. 5 is an architecture diagram of even still another Analog-Digital Converter according to an embodiment of the present invention.

To better describe the technical solution of the present invention, the following uses multi-channel ADCs that are shown in FIG. 2b, FIG. 2c, and FIG. 5 as an example to further describe the Analog-Digital Converter provided in the present invention.

As shown in FIG. 2b or FIG. 2c, an embodiment of the present invention provides a dual-channel Analog-Digital Converter 100, including:

a clock generator 101, configured to receive a first clock signal SysClk and perform gating control on the first clock signal, so as to generate second clock signals: a Clk1 and a Clk2, where phases of the Clk1 and the Clk2 are different;

an ADC channel 102 and an ADC channel 103 that are configured in a time interleaving manner, where each ADC channel is configured to receive an analog signal and perform, under the control of a second clock signal, sampling and analog-to-digital conversion on the analog signal, so as to obtain a digital signal; and the ADC channel 102 is corresponding to the second clock signal Clk1, and the ADC channel 103 is corresponding to the second clock signal Clk2; and an adder 104, configured to add two digital signals, which are generated by the ADC channel 102 and the ADC channel 103, together in a digital field, so as to obtain a digital output signal.

In this embodiment, the ADC channel 102 may include a sample-and-hold circuit 1021 and an analog-to-digital conversion circuit 1022 that are connected in series, where the sample-and-hold circuit 1021 is configured to receive the analog signal and perform, under the control of the Clk1, sampling on the analog signal, so as to obtain a first sampling signal; and the analog-to-digital conversion circuit 1022 is configured to perform analog-to-digital conversion on the first sampling signal on the basis of the Clk1, so as to obtain a digital signal.

A circuit structure of the ADC channel 103 may be the same as a circuit structure of the ADC channel 102 and also include a sample-and-hold circuit and an analog-to-digital conversion circuit that are connected in series. The ADC channel 103 differs from the ADC channel 102 in that the ADC channel 103 performs the sampling and the analog-to-digital conversion under the control of the Clk2. It should be learned that the sample-and-hold circuit 1021 is configured to collect an instantaneous value of the analog signal at a specific time point, and keep an output voltage unchanged in a period during which the analog-to-digital conversion circuit 1022 performs conversion. For specific implementation of the sample-and-hold circuit 1021 and the analog-to-digital conversion circuit 1022 by using hardware, reference may be made to the prior art, and details are not described herein.

Figure 3:
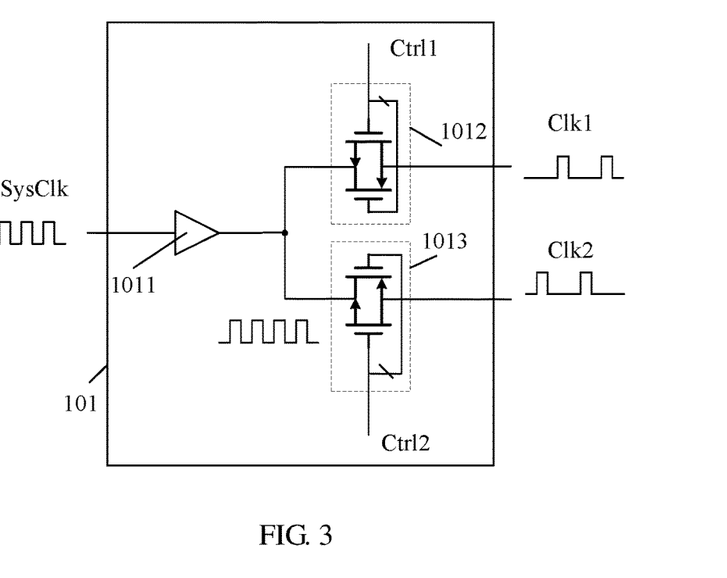
FIG. 3 is an architecture diagram of a clock generator according to an embodiment of the present invention.

In an implementation manner of this embodiment, as shown in FIG. 3, the clock generator 101 may include a first complementary metal oxide semiconductor (CMOS) transmission gate 1012 and a second CMOS transmission gate 1013. The first CMOS transmission gate 1012 and the second CMOS transmission gate 1013 are separately configured to receive the first clock signal SysClk and perform gating control on the first clock signal, so as to generate two second clock signals: a Clk1 and a Clk2.

Further, when a length of a transmission line that is from an input end used by the clock generator 101 to receive the first clock signal SysClk to a receive end used by all CMOS transmission gates to receive the first clock signal SysClk exceeds a preset value, the clock generator 101 may further include a buffer 1011, configured to enhance a driving capability of the first clock signal SysClk. The preset value may be an empirical value or determined by a signal attenuation degree of the first clock signal in a transmission process.

In an implementation manner of this embodiment of the present invention, the first CMOS transmission gate 1012 may include: a P-channel metal oxide semiconductor PMOS transistor, and an N-channel metal oxide semiconductor NMOS transistor, where: a source electrode of the PMOS transistor, a source electrode of the NMOS, and a signal input end of the first CMOS transmission gate 1012 are connected at one point, and a drain electrode of the PMOS transistor, a drain electrode of the NMOS transistor, and a signal output end of the first CMOS transmission gate 1012 are connected at one point; and the signal input end is configured to receive the first clock signal, and a gate electrode of the PMOS transistor and a gate electrode of the NMOS transistor are separately used as a control end of the first CMOS transmission gate 1012 and are configured to perform gating control on the first clock signal under an effect of a first control signal Ctrl1, so as to obtain a second clock signal Clk1 at the signal output end and output the second clock signal Clk1.

In another implementation manner of this embodiment of the present invention, the first CMOS transmission gate 1012 may include: a P-channel metal oxide semiconductor PMOS transistor, and an N-channel metal oxide semiconductor NMOS transistor, where: a source electrode of the PMOS transistor, a drain electrode of the NMOS, and a signal input end of the first CMOS transmission gate 1012 are connected at one point, and a drain electrode of the PMOS transistor, a source electrode of the NMOS transistor, and a signal output end of the first CMOS transmission gate 1012 are connected at one point; and the signal input end is configured to receive the first clock signal, and a gate electrode of the PMOS transistor and a gate electrode of the NMOS transistor are separately used as a control end of the first CMOS transmission gate and are configured to perform gating control on the first clock signal under an effect of a first control signal Ctrl1, so as to obtain a second clock signal Clk1 at the signal output end and output the second clock signal Clk1.

A difference between the two implementation manners is that connection relationships between the PMOS transistor and the NMOS transistor are different. However, because in a switch circuit, the source electrode and the drain electrode of the PMOS transistor and the NMOS transistor each are of a same effect and have no actual difference, both the PMOS transistor and the NMOS transistor separately use a channel between the source electrode and the drain electrode as a transmission channel. On-state or off-state of the transmission channel between the source electrode and the drain electrode of the PMOS transistor and the NMOS transistor each may be simultaneously controlled by applying bias voltage control signals that are inverse to each other to the gate electrode of the PMOS transistor and the NMOS transistor each. For example, a control signal may be applied to the gate electrode of the PMOS transistor, and an inverse signal of the control signal may be applied to the gate electrode of the NMOS transistor, so as to control on-state of the first CMOS transmission gate 1012 and implement the gating control on the first clock signal. A person skilled in the art should know that when a gate electrode voltage of the PMOS transistor is at a low electrical level, or a gate electrode voltage of the NMOS transistor is at a high electrical level, the first CMOS transmission gate 1012 is on; or when a gate electrode voltage of the PMOS transistor is at a high electrical level, or a gate electrode voltage of the NMOS transistor is at a low electric level, the first CMOS transmission gate 1012 is off. For a specific principle, reference may be made to the prior art, and details are not described herein. It should be noted that the control signal herein may be generated by an external logic circuit, and control signals corresponding to different CMOS transmission gates only need to meet a requirement that all pulse signals in all periods of the first clock signal are separately selected, or considering that the control signal and the first clock signal are of a same frequency, the control signal may also be obtained by performing a logic operation according to the first clock signal.

In this embodiment of the present invention, because the first clock signal is a rail-to-rail clock signal, the PMOS transistor and the NMOS transistor that are in the first CMOS transmission gate 1012 need to be simultaneously on or off, so that an equivalent resistance is relatively low when the first CMOS transmission gate 1012 is on. A structure of the second CMOS transmission gate 1013 may be the same as a structure of either of the two first CMOS transmission gates 1012 in the foregoing implementation manners.

Figure 4:
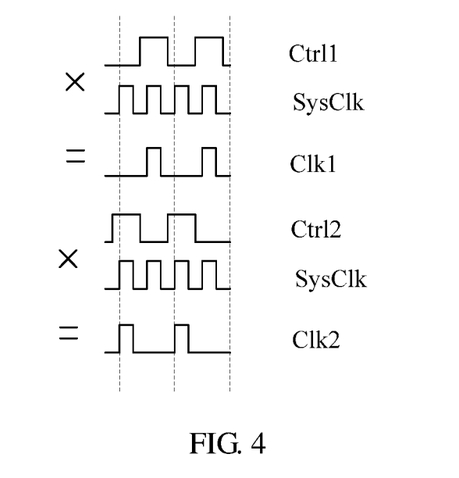
FIG. 4 is a time sequence diagram of gating control performed by a clock generator shown in FIG. 3.

In this embodiment of the present invention, the first CMOS transmission gate 1012 and the second CMOS transmission gate 1013 may separately perform, according to a time sequence control logic shown in FIG. 4, gating control on the first clock signal, so as to generate two second clock signals: a Clk1 and a Clk2. Specifically, the first CMOS transmission gate 1012 may select, under an effect of a first control signal Ctrl1, a $2a^{th}$ pulse in one first clock signal SysClk that is periodically sent, so as to form the new second clock signal Clk1. The second CMOS transmission gate 1013 may select, under an effect of a second control signal Ctrl2, a $2a-1^{th}$ pulse in one first clock signal SysClk that is periodically sent, so as to form the new second clock signal Clk2, where a is an integer that is greater than 0, and Clk1 may be considered to be a clock signal that is obtained after a phase of the Clk2 is delayed by $\pi$.

In this embodiment, as shown in FIG. 2b, the first clock signal may be a system clock signal in a system in which the Analog-Digital Converter 100 is located. It should be learned that in various existing systems that are based on a CMOS technology, for example, a system on a chip (System on a Chip, SOC) and a processor, to ensure integrity and consistency of a signal, a system generally integrates a device such as a phase-locked loop (phase-locked loop, PLL), so as to provide a common clock signal for another device inside the system. Compared with receiving a clock signal from the outside, using a system clock inside the system has an advantage such as that the system clock inside the system is faster and more accurate. In addition, as shown in FIG. 2c, the Analog-Digital Converter 100 further includes: an oscillator 105, where the oscillator 105 is configured to generate the first clock signal.

Further, as shown in FIG. 5, an embodiment of the present invention further provides a four-channel Analog-Digital Converter 400, including:

a clock generator 401, configured to receive a first clock signal SysClk and perform gating control on the first clock signal, so as to generate second clock signals: a Clk1, a Clk2, a Clk3, and a Clk4, where phases of the Clk1, the Clk2, the Clk3, and the Clk4 are different;

four ADC channels 402, 403, 406, and 407 that are configured in a time interleaving manner, where each ADC channel is configured to receive an analog signal and perform, under the control of one second clock signal, sampling and analog-to-digital conversion on the analog signal, so as to obtain a digital signal; the ADC channel 402 is corresponding to the second clock signal Clk1, the ADC channel 403 is corresponding to the second clock signal Clk2, the ADC channel 406 is corresponding to the second clock signal Clk3, and the ADC channel 407 is corresponding to the second clock signal Clk4; and a circuit structure of any one of the ADC channels is the same as a circuit structure of an ADC channel shown in FIG. 2b or FIG. 2c, and details are not described herein again; and an adder 404, configured to add four digital signals, which are generated by the four ADC channels: 402, 403, 406, and 407, together in a digital field, so as to obtain a digital output signal.

Figure 6:
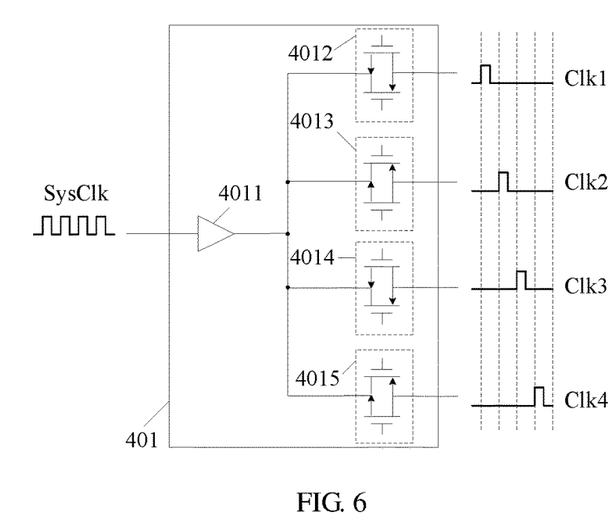
FIG. 6 is an architecture diagram of another clock generator according to an embodiment of the present invention.

In this embodiment, further, a specific circuit structure of the clock generator 401 is shown in FIG. 6. In FIG. 6, the clock generator 401 includes four CMOS transmission gates (4012, 4013, 4014, and 4015). The four CMOS transmission gates are configured to separately receive the first clock signal SysClk, and perform gating control on the first clock signal SysClk, so as to generate four second clock signals: a Clk1, a Clk2, a Clk3, and a Clk4.

Figure 7:
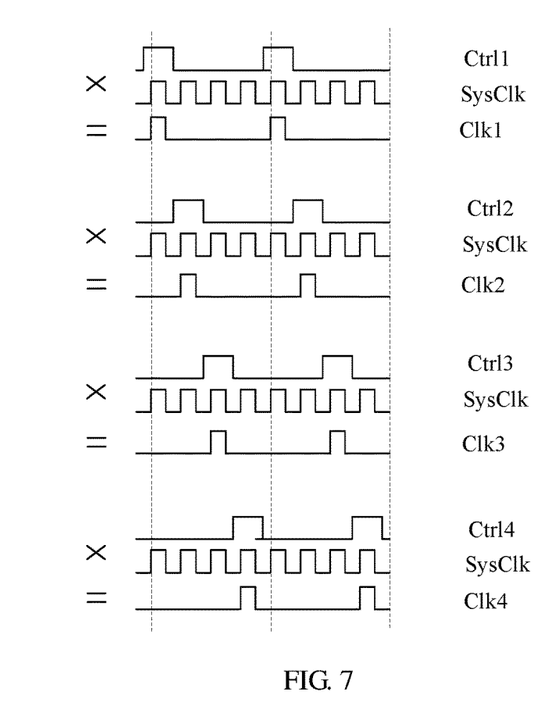
FIG. 7 is a time sequence diagram of gating control performed by a clock generator shown in FIG. 6.

Specifically, the four CMOS transmission gates 4012, 4013, 4014, and 4015 may separately perform, according to a time sequence control logic shown in FIG. 7, gating control on the first clock signal SysClk, so as to generate the four second clock signals: the Clk1, the Clk2, the Clk3, and the Clk4. Exemplarily, the CMOS transmission gate 4012 may select, under an effect of a first control signal Ctrl1, a $4b-3^{th}$ pulse in one first clock signal SysClk that is periodically sent, so as to form a new second clock signal Clk1; the CMOS transmission gate 4013 may select, under an effect of a second control signal Ctrl2, a $4b-2^{th}$ pulse in one first clock signal SysClk that is periodically sent, so as to form a new second clock signal Clk2; the CMOS transmission gate 4014 may select, under an effect of a third control signal Ctrl3, a $4b-1^{th}$ pulse in the first clock signal SysClk, so as to form a new second clock signal Clk3; and the CMOS transmission gate 4015 may select, under an effect of a fourth control signal Ctrl4, a $4b^{th}$ pulse in the first clock signal SysClk, so as to form a new second clock signal Clk4, where b is an integer that is greater than 0, and phase differences between the Clk1, Clk2, Clk3, and Clk4 is $\pi/2$.

It should be noted that in FIG. 2b-FIG. 2c and FIG. 5, a dual-ADC channel Analog-Digital Converter and a four-ADC channel Analog-Digital Converter are respectively used as an example for exemplary description of the technical solution of the present invention. According to the technical idea of the present invention, any multi-channel ADC obtained by a person skilled in the art by performing extension on the basis of FIG. 2b-FIG. 2c and FIG. 5 shall fall within the protection scope of the present invention.

Figure 8:
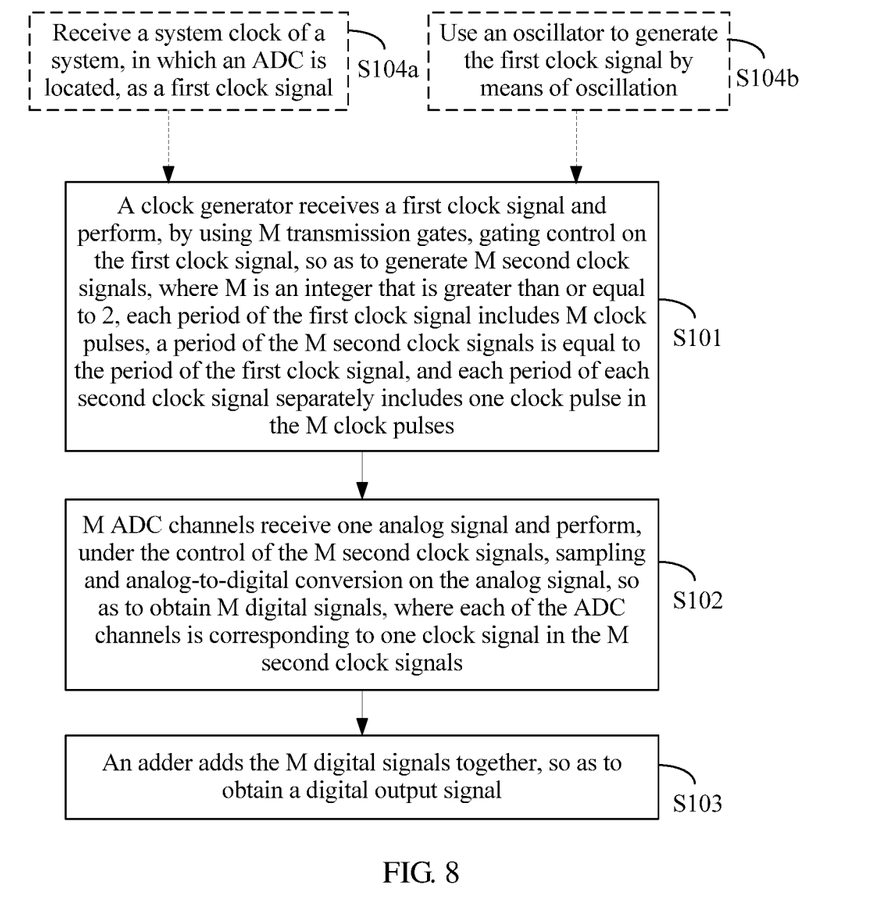
FIG. 8 is a schematic diagram of a signal conversion method according to an embodiment of the present invention.

As shown in FIG. 8, Embodiment 2 of the present invention further provides an analog-to-digital conversion method that is applied to an Analog-Digital Converter. The Analog-Digital Converter includes: a clock generator, M ADC channels that are configured in a time interleaving manner, and an adder, where the clock generator includes M transmission gates. Any transmission gate of the M transmission gates may include: a CMOS transmission gate, a PMOS transmission gate, or an NMOS transmission gate. That is, any transmission gate of the M transmission gates may be the CMOS transmission gate, the PMOS transmission gate, or the NMOS transmission gate; or may be formed by combining multiple transmission gates, for example, two CMOS transmission gates connected in series form a new transmission gate. The method includes:

S101. The clock generator receives a first clock signal and perform, by using the M transmission gates, gating control on the first clock signal, so as to generate M second clock signals, where M is an integer that is greater than or equal to 2, each period of the first clock signal includes M clock pulses, a period of the M second clock signals is equal to the period of the first clock signal, and each period of each second clock signal includes one clock pulse of the M clock pulses. Exemplarily, the clock generator may select one clock pulse from the M clock pulses included in each period of the first clock signal, so as to generate the M second clock signals.

S102. The M ADC channels receive one analog signal and separately perform, under the control of the M second clock signals, sampling and analog-to-digital conversion on the analog signal, so as to obtain M digital signals, where each ADC channel is corresponding to one clock signal of the M second clock signals.

S103. The adder adds the M digital signals together in a digital field, so as to obtain a digital output signal.

According to the method provided in this embodiment, multiple transmission gates are configured to perform gating control on a first same-source clock signal, so as to generate multiple second clock signals. Because in a gating control process, one clock pulse in each period of the first clock signal is transmitted by using a channel between a source electrode and a drain electrode of each MOS transistor (that is, a PMOS transistor and/or an NMOS transistor) in the transmission gate, and does not pass through any logic gate, a time skew between the multiple second clock signals is related only to whether switch-on resistances between the multiple transmission gates match. When the transmission gate is on, all MOS transistors are in a deep linear region, and because mismatching between threshold voltages of the respective MOS transistors of the transmission gates imposes very little impact on the time skew between the multiple second clock signals, so that low mismatching between the multiple second clock signals can be implemented.

In this embodiment, phases of the M second clock signals form an arithmetic progression whose common difference is $2\pi/M$, where $2\pi$ indicates a period of the M second clock signals.

In this embodiment, further, in an implementation manner, if the first clock signal is a system clock signal of a system in which the ADC is located, before S101, the method may further include:

S104a. Receive the system clock of the system in which the ADC is located as the first clock signal.

In another possible implementation manner, the method further includes:

S104b. Use an oscillator to generate the first clock signal by means of oscillation, where the oscillator is disposed in the ADC.

It should be noted that the analog-to-digital conversion method in this embodiment is proposed on the basis of the Analog-Digital Converter (as shown in FIG. 2b, FIG. 2c, and FIG. 5) provided in the foregoing Embodiment 1, and for a related technical feature, reference may be made to Embodiment 1.

Figure 9:
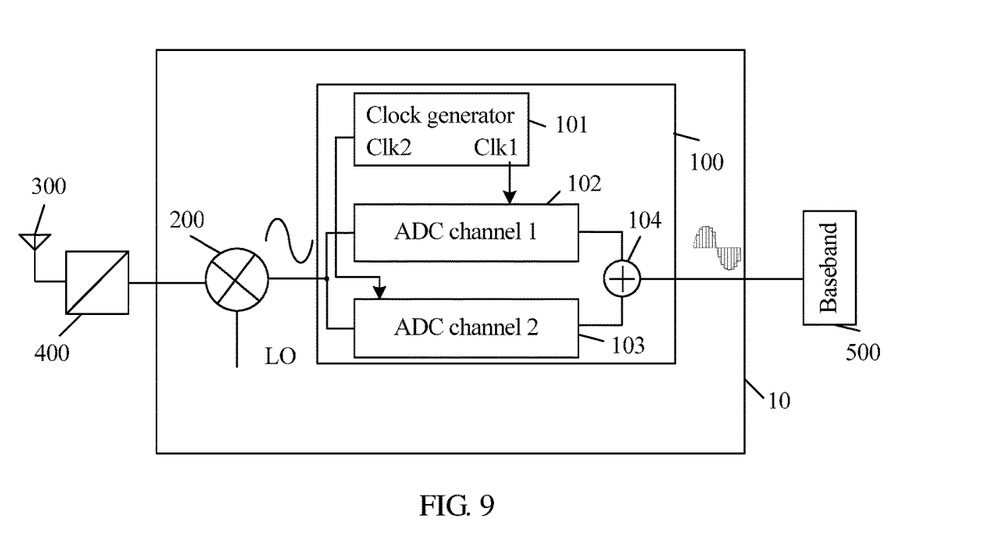
FIG. 9 is an architecture diagram of a radio transceiver according to an embodiment of the present invention.

As shown in FIG. 9, Embodiment 3 of the present invention further provides a radio transceiver 10 that is applied to a communications device, where the communications device includes but is not limited to a base station and a mobile terminal.

In FIG. 9, the radio transceiver 10 includes a frequency mixer 200 and the analog-to-digital converter 100 described in the foregoing Embodiment 1.

The frequency mixer 200 is configured to receive a radio-frequency signal and perform, by using a preset local oscillator (local oscillator, LO) signal, frequency mixing on the radio-frequency signal, so as to obtain an analog fundamental-frequency (also be referred to as baseband) signal. It should be noted that the frequency mixing may be performed by using various frequency conversion manners such as a zero intermediate frequency and an intermediate frequency, which are not limited herein.

The ADC 100 is configured to receive the analog fundamental-frequency signal and perform digital-to-analog conversion on the analog fundamental-frequency signal, so as to obtain and output a digital fundamental-frequency signal. It should be noted that the analog signal received by the ADC 100 in Embodiment 1 is the analog fundamental-frequency signal in this embodiment, and the digital output signal output by the ADC 100 is the digital fundamental-frequency signal in this embodiment.

A person skilled in the art should know that a communications device generally includes an antenna 300, configured to receive, by using an air interface, a radio signal sent by another device. When the radio signal uses a technology such as carrier aggregation, the communications device may further include an antenna multicoupler 400, configured to separate all carriers in the radio signal, so as to obtain a radio-frequency signal. Further, the communications device may include a baseband chip 500 (or a baseband processor), configured to process the digital fundamental-frequency signal generated by the ADC 100. In addition, this embodiment describes the radio transceiver 10 from the perspective of a receiver; when the radio transceiver 10 is used as a transmitter, signal processing processes of all modules in the radio transceiver 10 are exactly opposite, and details are not described herein again.

In addition, the radio transceiver 10 in this embodiment of the present invention may be integrate into a radio-frequency chip, or be disposed in multiple chips, for example, the frequency mixer 200 is located in a radio-frequency chip, and the ADC 100 is located in a base band chip, and this embodiment imposes no specific limitation herein. For another feature of the ADC 100 in this embodiment, reference may be made to the description in Embodiment 1, and details are not described herein again.

It should be understood that specific embodiments described herein are merely common embodiments of the present invention, but are not intended to limit the present invention. Any modification, equivalent replacement, and improvement made without departing from the spirit and principle of the present invention shall fall within the protection scope of the present invention.

What is claimed is:

1. An Analog-Digital Converter (ADC), comprising:
a clock generator, comprising M switchers, wherein the M switchers are configured to receive a first clock signal and separately perform gating control on the first clock signal to generate M second clock signals separately, wherein M is an integer that is greater than or equal to 2, and wherein each of the M switchers comprises at least one of a complementary metal oxide semiconductor (CMOS) transmission gate, a P-channel metal oxide semiconductor (PMOS) transmission gate, or an N-channel metal oxide semiconductor (NMOS) transmission gate;
M time-interleaved ADC channels, configured to receive one analog signal and separately perform, under the control of the M second clock signals, sampling and analog-to-digital conversion on the analog signal, so as to obtain M digital signals, wherein each ADC channel is corresponding to one clock signal of the M second clock signals; and
an adder, configured to add the M digital signals together to obtain a digital output signal.

2. The Analog-Digital Converter according to claim 1, wherein phases of the M second clock signals form an arithmetic progression whose common difference is $2\pi/M$, and $2\pi$ indicates a period of the M second clock signals.

3. The Analog-Digital Converter according to claim 1, wherein any ADC channel of the M ADC channels comprises a sample-and-hold circuit and an analog-to-digital conversion circuit that are connected in series, wherein the sample-and-hold circuit is configured to receive the analog signal and perform, under the control of one clock signal of the M second clock signals, sampling on the analog signal, so as to obtain a first sampling signal; and the analog-to-digital conversion circuit is configured to perform analog-to-digital conversion on the first sampling signal under the control of the one clock signal, so as to obtain a digital signal.

4. The Analog-Digital Converter according to claim 1, each period of the first clock signal comprises M clock pulses, a period of each second clock signals is equal to the period of the first clock signal, and the period of each second clock signal comprises one clock pulse of the M clock pulses.

5. The Analog-Digital Converter according to claim 1, wherein the at least one CMOS transmission gate comprises: a PMOS transistor and an NMOS transistor, wherein:
a source electrode of the PMOS transistor, a drain electrode of the NMOS transistor, and a signal input end of the at least one CMOS transmission gate are connected at one point, and a drain electrode of the PMOS transistor, a source electrode of the NMOS transistor, and a signal output end of the at least one CMOS transmission gate are connected at one point; or a source electrode of the PMOS transistor, a source electrode of the NMOS, and a signal input end of the at least one CMOS transmission gate are connected at one point, and a drain electrode of the PMOS transistor, a drain electrode of the NMOS transistor, and a signal output end of the at least one CMOS transmission gate are connected at one point; and
the signal input end is configured to receive the first clock signal; and a gate electrode of the PMOS transistor and a gate electrode of the NMOS transistor are separately used as a control end of the at least one CMOS transmission gate and are configured to perform gating control on the first clock signal under an effect of a control signal, so as to obtain a second clock signal at the signal output end and output the second clock signal.

6. The Analog-Digital Converter according to claim 5, wherein the control signal is generated by an external logic circuit or obtained by performing a logic operation according to the first clock signal.

7. The Analog-Digital Converter according to claim 5, wherein the gate electrode of the PMOS transistor is specifically configured to receive the control signal, and the gate electrode of the NMOS transistor is specifically configured to receive an inverting signal of the control signal, so as to control on-state of the at least one CMOS transmission gate, thereby implementing gating control on the first clock signal.

8. The Analog-Digital Converter according to claim 1, wherein the Analog-Digital Converter further comprises: an oscillator, configured to generate the first clock signal.

9. The Analog-Digital Converter according to claim 1, wherein the first clock signal is a system clock signal that is independent of the ADC.

10. The Analog-Digital Converter according to claim 1, wherein the clock generator further comprises a buffer, configured to: receive the first clock signal, enhance a driving capability of the first clock signal, and transmit the first clock signal with an enhanced driving capability to the M switchers.

11. An analog-to-digital conversion method, applied to an ADC, wherein the ADC comprises a clock generator, M time-interleaved ADC channels, and an adder, the clock generator comprises M switchers, and each of the M switchers comprises at least one of a complementary metal oxide semiconductor (CMOS) transmission gate, a P-channel metal oxide semiconductor (PMOS) transmission gate, or an N-channel metal oxide semiconductor (NMOS) transmission gate, and the method comprises:
receiving, by the clock generator, a first clock signal, and performing, by using the M switchers, gating control on the first clock signal to generate M second clock signals, wherein M is an integer that is greater than or equal to 2;
receiving, by the M time-interleaved ADC channels, one analog signal and separately performing, under the control of the M second clock signals, sampling and analog-to-digital conversion on the analog signal, so as to obtain M digital signals, wherein each ADC channel is corresponding to one clock signal of the M second clock signals; and
adding, by the adder, the M digital signals together to obtain a digital output signal.

12. The method according to claim 11, further comprising: generating the first clock signal by means of oscillation.

13. The method according to claim 11, wherein phases of the M second clock signals form an arithmetic progression whose common difference is $2\pi/M$, and $2\pi$ indicates a period of the M second clock signals.

14. The method according to claim 11, further comprising: receiving, by the clock generator, a system clock signal in a system in which the ADC is located and using the system clock signal as the first clock signal.

* * * * *